(12) United States Patent
Zhang et al.

(10) Patent No.: US 7,183,960 B1
(45) Date of Patent: Feb. 27, 2007

(54) METHOD AND APPARATUS FOR SYSTEMATIC ADJUSTMENTS OF RESISTORS IN HIGH-SPEED INTEGRATED CIRCUITS

(76) Inventors: Minghao (Mary) Zhang, 3092 Adams Way, Santa Clara, CA (US) 95051; John C. Tung, 3092 Adams Way, Santa Clara, CA (US) 95051

( * ) Notice: Subject to any disclaimer, the term of this patent is extended or adjusted under 35 U.S.C. 154(b) by 0 days.

(21) Appl. No.: 11/355,742

(22) Filed: Feb. 16, 2006

(51) Int. Cl.
*H03M 1/78* (2006.01)

(52) U.S. Cl. ............... 341/154; 341/156; 341/145; 341/155

(58) Field of Classification Search .......... 341/154, 341/155, 156, 145, 118, 120
See application file for complete search history.

(56) References Cited

U.S. PATENT DOCUMENTS

| | | | | |
|---|---|---|---|---|
| 4,897,650 A | * | 1/1990 | Shott et al. ............. | 341/120 |
| 5,157,397 A | * | 10/1992 | Vernon .................. | 341/159 |
| 5,204,697 A | * | 4/1993 | Schmidlin ............... | 347/115 |
| 5,598,161 A | * | 1/1997 | Yamada .................. | 341/159 |
| 5,877,718 A | * | 3/1999 | Andoh et al. ............ | 341/155 |
| 6,384,763 B1 | * | 5/2002 | Leung et al. ............ | 341/154 |
| 6,459,400 B1 | * | 10/2002 | Steinbach ............... | 341/156 |
| 6,570,523 B1 | * | 5/2003 | Bacrania et al. ......... | 341/155 |
| 6,628,216 B2 | * | 9/2003 | Chen et al. ............. | 341/120 |
| 6,937,178 B1 | * | 8/2005 | Rempfer et al. ......... | 341/154 |
| 7,102,424 B2 | * | 9/2006 | Vorenkamp .............. | 327/540 |

* cited by examiner

*Primary Examiner*—Linh V. Nguyen
(74) *Attorney, Agent, or Firm*—Joe Zheng

(57) ABSTRACT

Techniques for designing high-speed integrated circuits are disclosed. According to one aspect of the present invention, an interpolation circuit is disclosed. A method for designing such an interpolation circuit comprises determining an initial value for all resistors in the interpolation circuit, examining whether outputs from the interpolation circuit are evenly spaced across a predefined range of input signals, and when the outputs are not evenly spaced across a predefined range of input signals, adjusting each of the resistors in reference to the outputs so that the outputs are evenly spaced across a predefined range of input signals.

17 Claims, 10 Drawing Sheets

| Interpolation Resistor Section 1 | | Interpolation Resistor Section 2 | |
|---|---|---|---|
| Components | Ratio | Components | Ratio |
| RI111 | 1.0000 | RI211 | 0.9624 |
| RI112 | 0.8011 | RI212 | 0.7634 |
| RI113 | 0.6183 | RI213 | 0.6075 |
| RI114 | 0.5000 | RI214 | 0.4893 |
| RI115 | 0.4301 | RI215 | 0.4194 |
| RI116 | 0.3710 | RI216 | 0.3710 |
| RI117 | 0.3495 | RI217 | 0.3387 |
| RI118 | 0.3387 | RI218 | 0.3333 |
| RI119 | 0.3333 | RI219 | 0.3226 |
| RI120 | 0.3548 | RI220 | 0.3495 |
| RI121 | 0.3817 | RI221 | 0.3656 |
| RI122 | 0.4194 | RI222 | 0.4140 |
| RI123 | 0.4776 | RI223 | 0.4731 |
| RI124 | 0.5699 | RI224 | 0.5484 |
| RI125 | 0.6613 | RI225 | 0.6559 |
| RI126 | 0.8118 | RI226 | 0.7796 |

FIG. 9

METHOD AND APPARATUS FOR SYSTEMATIC ADJUSTMENTS OF RESISTORS IN HIGH-SPEED INTEGRATED CIRCUITS

BACKGROUND OF THE INVENTION

1. Field of the Invention

The invention is generally related to the area of integrated circuits designs. More particularly, the invention is related to designs of high-speed integrated circuits that may include, but not be limited to, analog-to-digital converters (ADC).

2. The Background of Related Art

A simple way to make a high-speed and high resolution ADC is to use a full-flash structure as shown in FIG. 1 in which an 8-bit resolution with an array of 255 comparators is demonstrated. This type of converter includes an array of $2^n-1$ comparators with n being the number of bits. The input signal is provided to a sample-and-hold circuit first for handling high input frequency purpose. Each comparator is connected with one input to a reference voltage. A resistor ladder generally generates this reference voltage. The output of the comparators is then fed into an encoding logic that generates the data bits. The advantage of this type of full-flash converter includes its easy design, though its inherent offset compensation is required in order to avoid using large transistors in the comparators for matching reasons. The disadvantage of this type of full-flash converters is evident. If, for example, a precision of 8-bit is needed, then 255 comparators are required, resulting in a large chip area and high power consumption.

The folding and interpolating technique as shown in FIG. 2 has a lower comparator count than the full-flash structure, and thus providing lower power consumption and smaller area potentials. Description of an ADC using the folding and interpolating architecture may be found in 'An 8-bit Video ADC incorporating Folding and Interpolating Techniques,' authored by R. J. VAN DE GRIFT, p. 944–953, IEEE Journal of solid-state Circuits, Vol. SC-22, No. 6, December 1987, which is hereby incorporated by reference.

FIG. 2 shows a simplified block diagram of an 8-bit ADC using the folding and interpolating technique. The input voltage is applied to a preprocessing circuit depicted as a 'folding circuit' and the output of this folding circuit is coupled to a 5-bit fine ADC. The input signal is also directly coupled to a 3-bit coarse ADC. The operation of the folding circuit is illustrated in FIG. 3, where the transfer function of the folding circuit is shown. The 'zig-zag' shaped transfer curve covers the entire range of the input Vin (normalized for illustration), and the output voltage of the folding circuit needs to be converted to only 32 levels corresponding to the five least significant bits (LSB's) of the ADC output code. In order to distinguish the eight possible input voltages that correspond to the same folding signal output, the 3-bit coarse ADC is required to generate the three most significant bits (MSB's) of the ADC. The total comparator count for this folding converter is 32 (fine)+8 (coarse)=40, which is much less than 255 comparators for the full-flash structure. It is noted that the three most significant bits and the five least significant bits are generated synchronously, and thus, a sample-and-hold function is basically not required. The throughput of a folding ADC is equal to that of a full-flash structure. The transfer of the folding circuit in FIG. 3 is called '8-times-folding' because, for each folding output, there are eight possible input voltages.

A more detailed folding amplifier and resistor-interpolating ADC concept is illustrated in FIG. 4. The detailed function description can be found from U.S. Pat. No. 4,831,379 (Pat. No. '379) issued to Tudy L.van de Plassche, which is incorporated herein by reference. Although the holding amplifier reduces the comparator counter, the number of comparators required is still large. The principle of the interpolating technique after a folding amplifier is to reduce the number of comparators by simply omitting one out of every two comparators and recovering a missing signal by interpolation between two output signals. The interpolation can be implemented readily by inserting a resistive interpolation ladder containing two resistors between the outputs of the two comparators. At the taps of these resistors, the missing signal can be accurately reconstructed.

U.S. Pat. No. 4,897,656 (Pat. No. '656) issued to Rudy L. van de Plassche provides a description of a similar ADC architecture with a delay network that compensates a delay experienced in Pat. No. '379. The delay network is formed with two or more additional pairs of impedance elements that are used in supplying interpolation output signals at multiple pairs of corresponding interpolation output points. Nevertheless, the delay network still includes a fairly large number of impedance elements.

It is desirable to provide a high-speed ADC architecture with a least number of components without compromising the performance thereof.

SUMMARY OF THE INVENTION

This section is for the purpose of summarizing some aspects of the present invention and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present invention.

In general, the present invention pertains to techniques for designs of high-speed integrated circuits that may include, but not be limited to, analog-to-digital converters (ADC). According to one aspect of the present invention, an interpolation circuit is disclosed. A method for designing such an interpolation circuit comprises determining an initial value for all resistors in the interpolation circuit, examining whether outputs from the interpolation circuit are evenly spaced across a predefined range of input signals, and when the outputs are not evenly spaced across a predefined range of input signals, adjusting each of the resistors in reference to the outputs so that the outputs are evenly spaced across a predefined range of input signals.

There are numerous functions, benefits and advantages in the present invention, one of them is that the present invention provides techniques for adjusting resistant elements in an interpolation circuit in such a way that outputs including interpolated outputs are evenly spaced across a predefined range of inputs to the interpolation circuit.

According to one embodiment, the present invention is an interpolation circuit, the interpolation circuit comprises resistors divided into two groups, the resistors in each of the groups connected in series, the two groups respectively receiving two complementary inputs from which interpolated outputs are generated, wherein the resistors originally designed to be identical are adjusted to be non-identical to each other so that the outputs are evenly spaced across a predefined range of the input signals.

Other objects, features, and advantages of the present invention will become apparent upon examining the following detailed description of an embodiment thereof, taken in conjunction with the attached drawings.

BRIEF DESCRIPTION OF THE DRAWING

These and other features, aspects, and advantages of the present invention will become better understood with regard to the following description, appended claims, and accompanying drawings where:

FIG. 9 is a table showing a tabulated design of resistor interpolation with an interpolation factor of sixteen according to one embodiment.

DETAILED DESCRIPTION OF THE PREFERRED EMBODIMENTS

The detailed description of the present invention is presented largely in terms of procedures, steps, logic blocks, processing, or other symbolic representations that directly or indirectly resemble the operations of optical devices or systems coupled to optical networks. These process descriptions and representations are typically used by those skilled in the art to most effectively convey the substance of their work to others skilled in the art. Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Figures 5A, 5B:
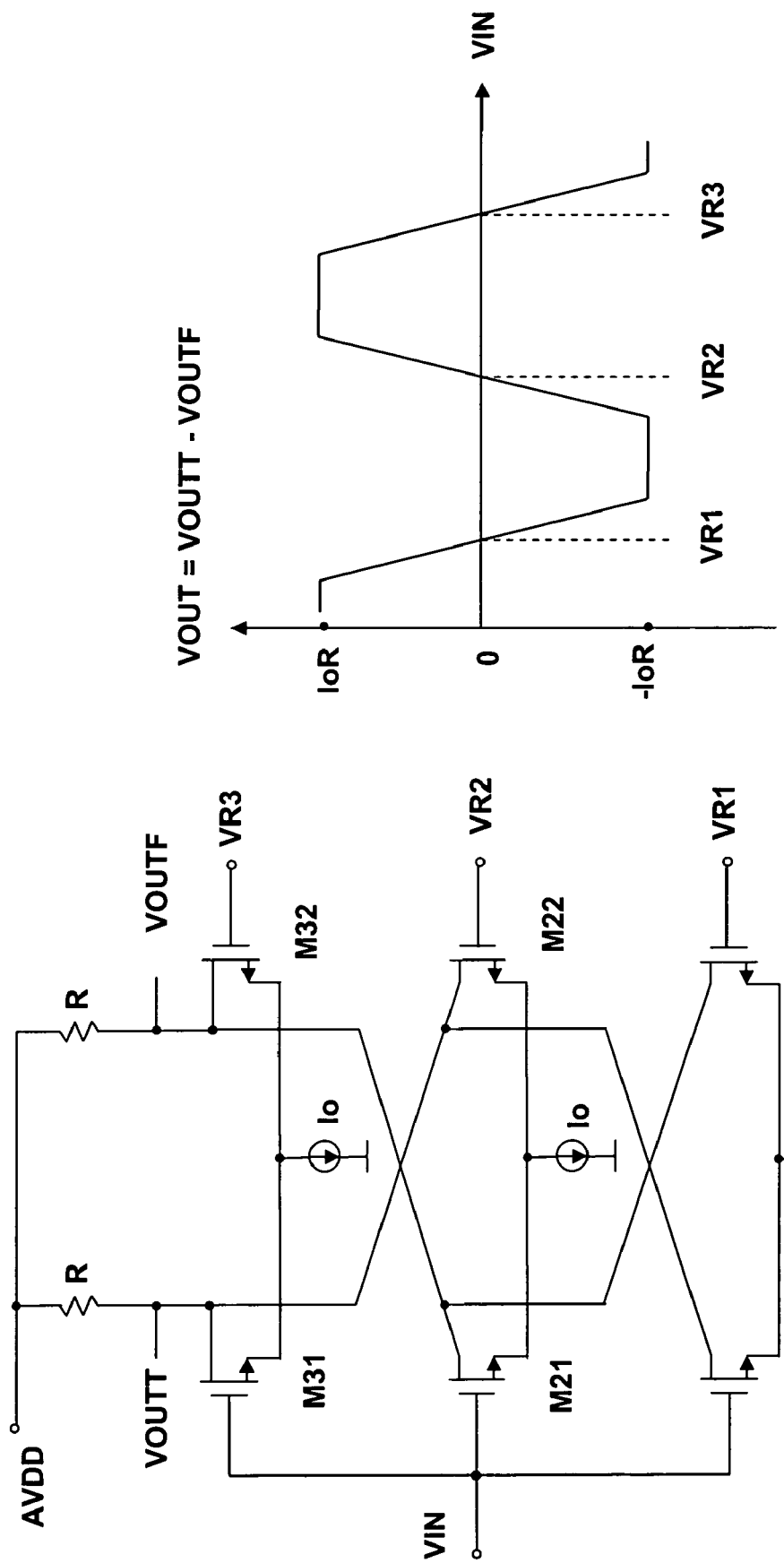
FIG. 5A shows an exemplary analog folding circuit according to one embodiment of the present invention.
FIG. 5B shows a corresponding transfer function between the input and the output of the circuit of FIG. 5A.

FIG. 5A shows an exemplary analog folding circuit according to one embodiment of the present invention. FIG. 5B shows a corresponding transfer function between the input and the output of the circuit of FIG. 5A. To facilitate the understanding of the folding and interpolation operation, FIG. 6A shows an exemplary resistive interpolation circuit, and FIG. 6B shows how a signal is being interpolated.

In operation, when an input voltage is less than all reference voltage, VR1, VR2, and VR3, transistors M12, M22, and M32 are all turn on, and the output of VOUTF will see $-2I_oR$, and that of VOUTT will see $-I_oR$. The differential output VOUT is equal to VOUTT subtracted by VOUTF, as a result, the output of VOUT is $I_oR$. When the input voltage reaches VR1, the output is at 0. When the input voltage exceeds the reference voltage, VR1, and less than the other reference voltages, VR2 and VR3, transistor M11 turns on, as well as transistors M22, and M32, and generates output of $-2I_oR$ for VOUTT and $-I_oR$ for VOUTF. As a result, the differential output of VOUT is at $-I_oR$. This procedure is continuously going on until reaches full-scale of the input.

Figure 6B:
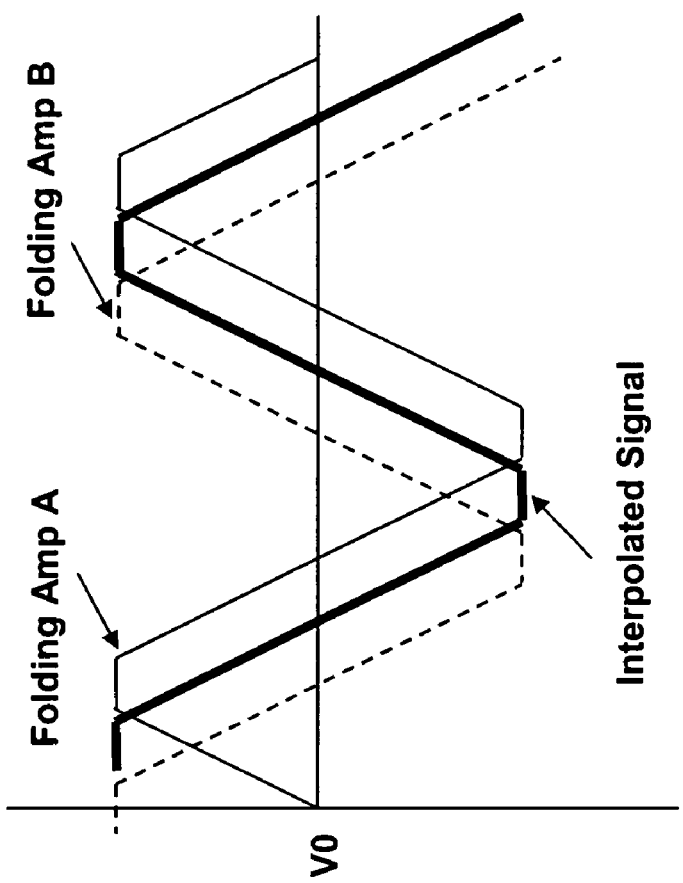
FIG. 6B shows how a signal is being interpolated.
Figure 6A:
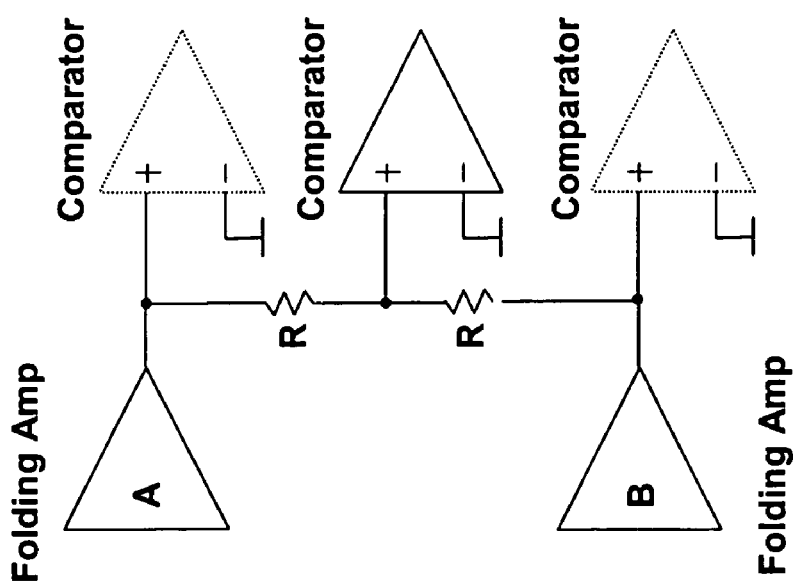
FIG. 6A shows an exemplary resistive interpolation circuit.

Two outputs from two respective folding circuits are then supplied to two equally valued resistors that interpolate the outputs to produce an interpolated signal via a comparator as shown in FIG. 6A and FIG. 6B.

Figure 7:
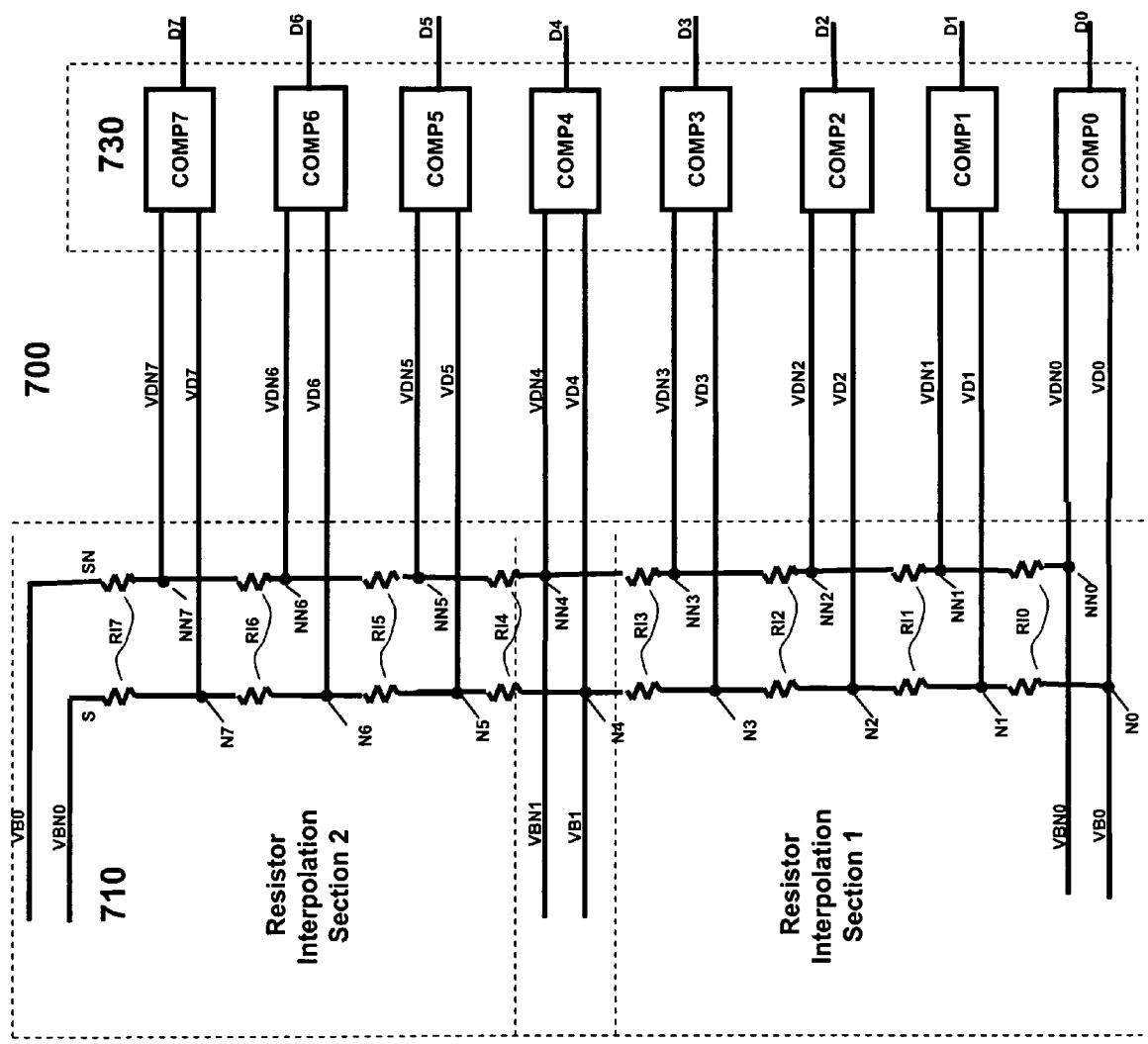
FIG. 7 is a simplified resistor interpolation circuit to show systematic adjustments thereof in accordance with an embodiment of the present invention.

Referring now to FIG. 7, there shows an exemplary architecture of resistor interpolation. For easy understanding, FIG. 7 has been simplified to include two resistor interpolation sections 1 and 2 with four input signals VB0, VB1, VBN0 and VBN1, where VB0 and VBN0 are complementary from one folding circuit, and VB1 and VBN1 are complementary from another folding circuit. The two pairs of input signals VB0/VBN0 and VB1/VBN1 are normally generated in response to an analog input voltage in a fold-and-interpolation analog-to-digital converter (FIADC). Each of these two resistor interpolation sections has a resistor interpolating factor of four. In order words, two of these resistor interpolation sections produce eight outputs by interpolation.

In the resistor interpolation section 1, the four interpolating resistors: RI0, RI1, RI2, and RI3 are coupled to the two complementary input signals VB0/VBN0 and VB1/VBN1. The signals labeled as VD0/VDN0 and VD4/VDN4 are the same as the input signals VB0/VBN0 and VB1/VBN1. The signals labeled as VD1/VDN1, VD2/VDN2, and VD3/VDN3 are the interpolated signals.

Figure 1:
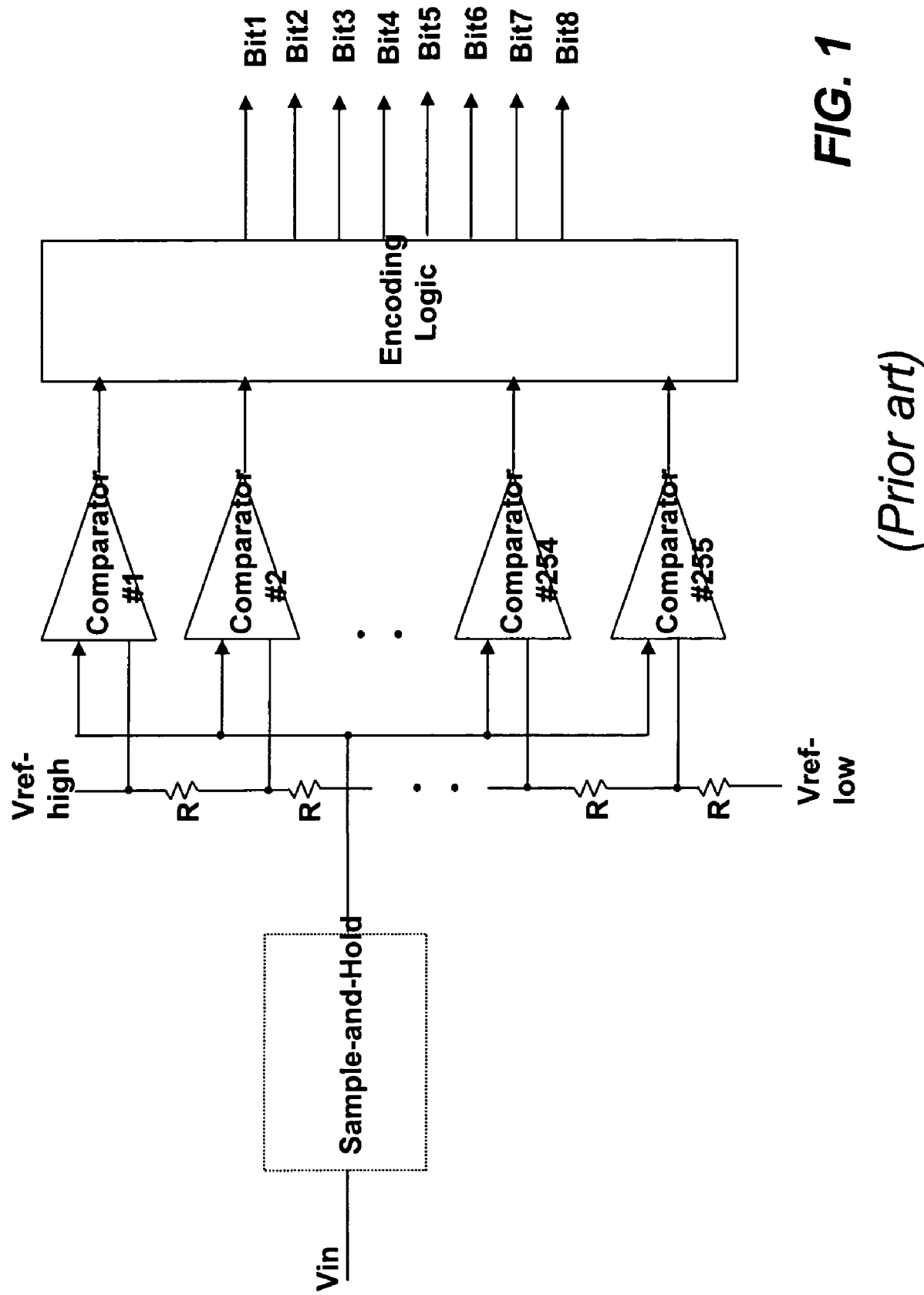
FIG. 1 is an exemplary block diagram of an 8-bit full-flash ADC.
Figure 2:
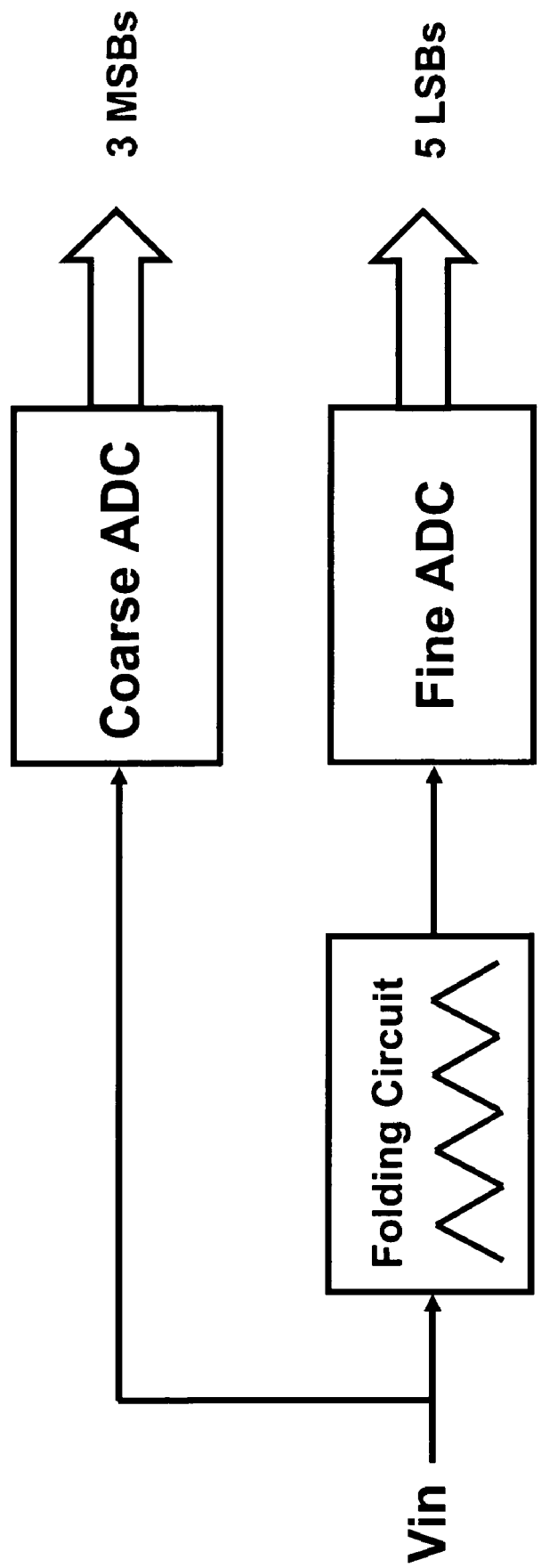
FIG. 2 is a simplified block diagram of an 8-bit folding and interpolating ADC.
Figure 3:
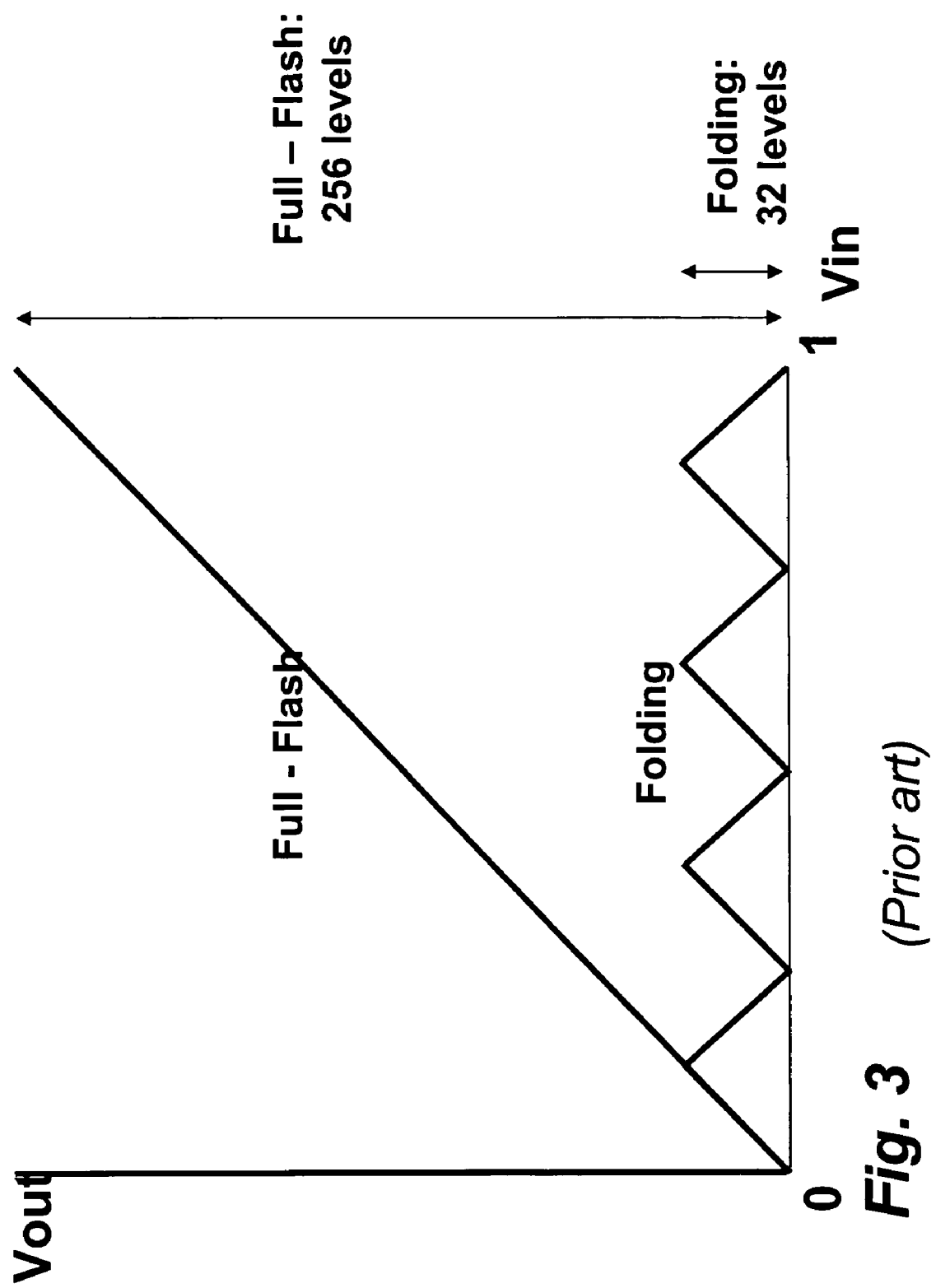
FIG. 3 is a transfer function curve (zig-zag) of a folding circuit in comparison with a transfer function curve (straight line) of a full-flash ADC.
Figure 4:
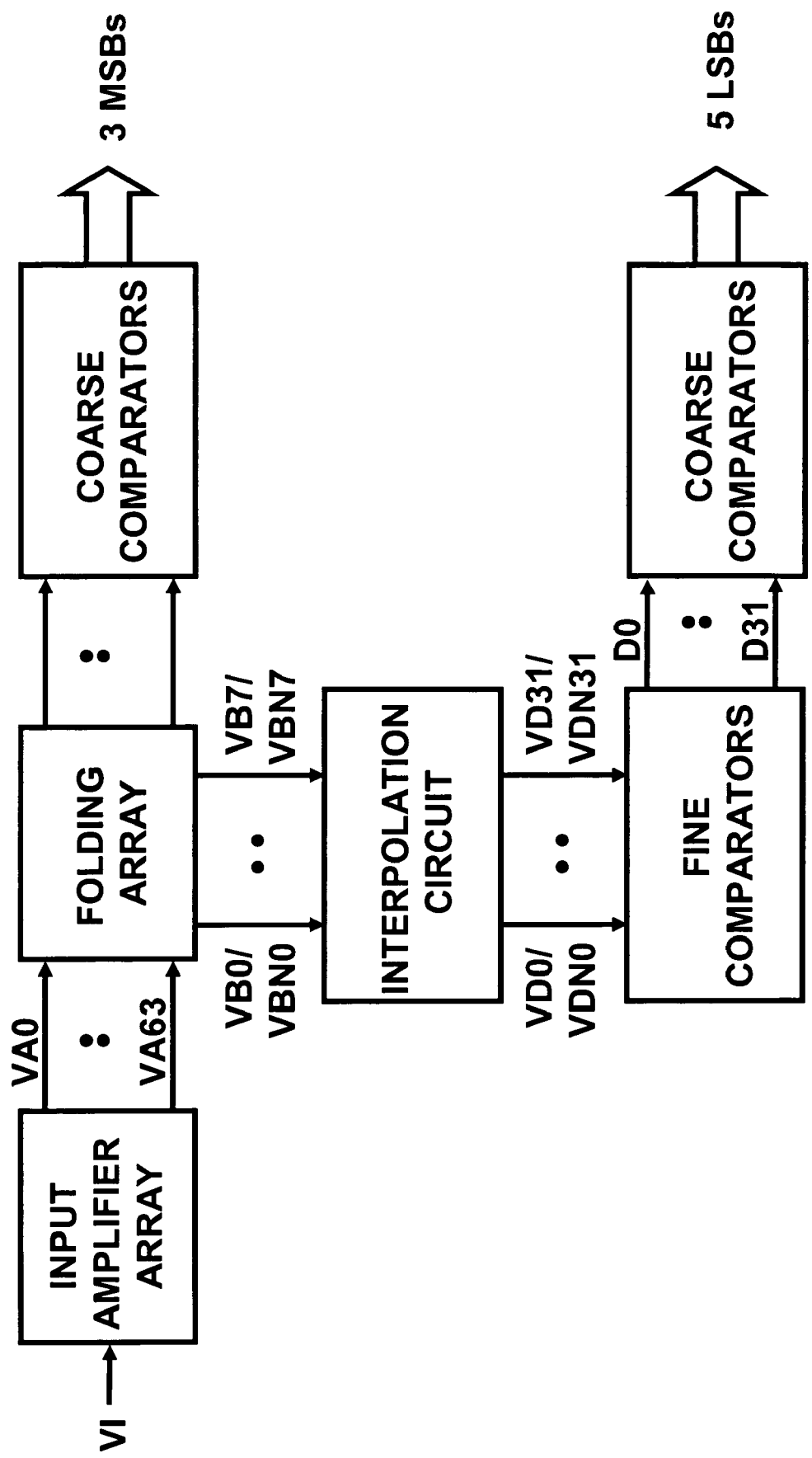
FIG. 4 is a more detailed block diagram of an 8-bit folding-and-interpolating-resistor ADC.

In the resistor interpolation section 2, the four interpolating resistors: RI4, RI5, Ri6, and RI7 are coupled to the two complementary input signals VB1/VBN1 and VBN0/VB0. The signals labeled as VD4/VDN4 are same as the input signals VB1/VBN1. The signals labeled as VD5/VDN5, VD6/VDN6, and VD7/VDN7 are interpolated signals. It shall be noted that one of the input signals at one end with its polarity reversed. The two resistor strings, viewed from VB0 to VBN0 or VBN0 to VB0, essentially become a ring of resistors. It makes the resistor interpolation section 1 concatenated to the resistor interpolation section 2, resistor interpolation section 2 concatenated back to the resistor interpolation section 1. This enables the interpolation to extend over all the VB cycles as VI ranges from VA0 to VA63 as shown in FIG. 4.

In theory, the resistors, which are labeled as RI0, RI1, ..., RI7, shall all have the same value. A total of 16 different voltages VD0–VD7 and VDN0–VDN7 are generated. The comparator array 730 includes eight master-slave flip-flops comparators COMP0–COMP7. Each comparator COMPq compares complementary signals VDq and VDNq to generate a digital bit Dq, where q is from 0 to 7.

Figure 8:
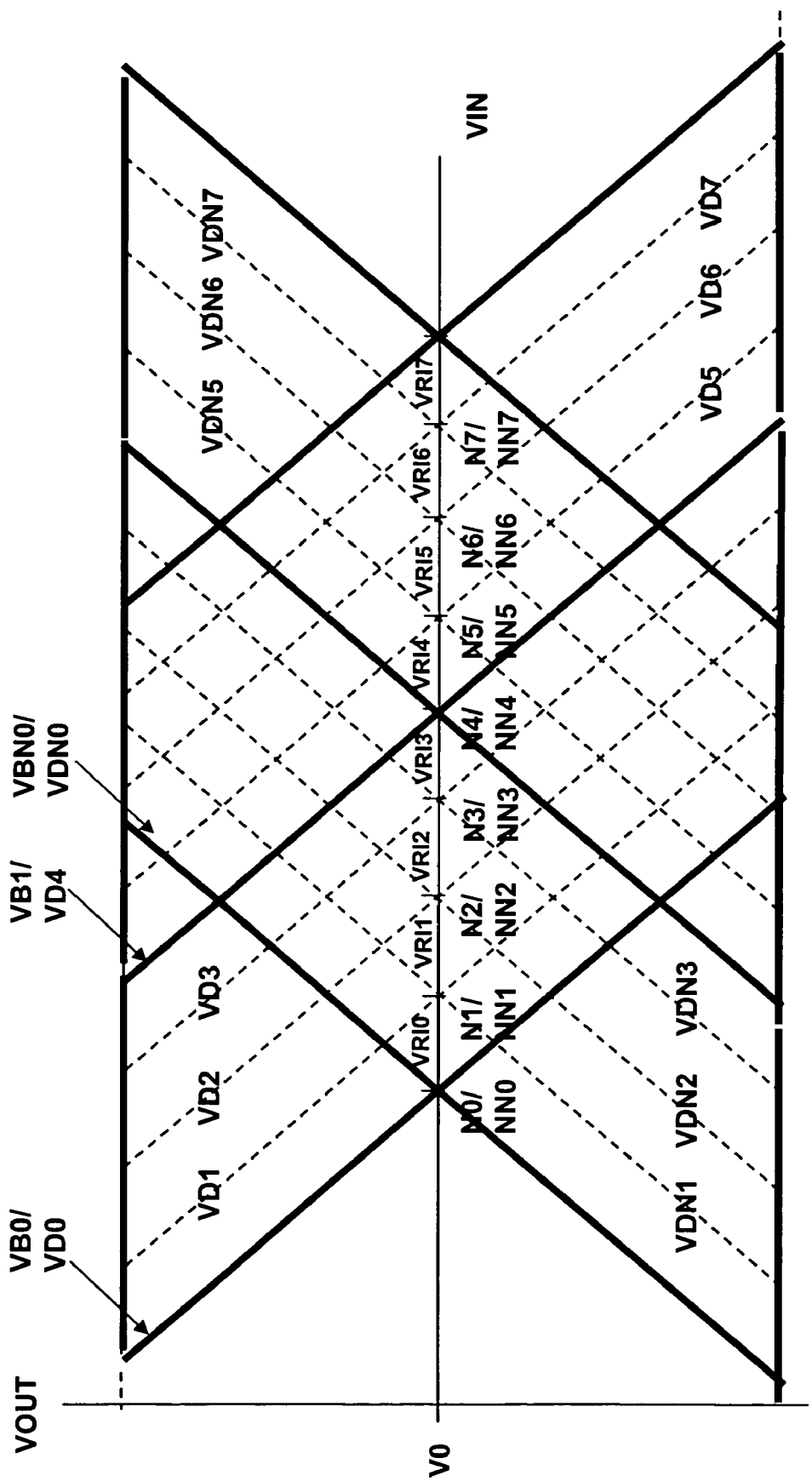
FIG. 8 shows a waveform of the resistor interpolation.

Again in theory, a sample of the interpolation is illustrated in FIG. 8 which shows that interpolated voltages VD1, VD2, and VD3 shall be equally spaced between the input voltages VB0 and VB1, and interpolated voltages VD5, VD6, and VD7 are also equally spaced between input voltages VB1 and VB0.

Nevertheless, in reality, due to the inherent parasitic effects of the interpolation resistors operating at high frequency, together with input frequencies parasitic effects as well as output loadings, the interpolated voltages VD1, VD2, and VD3 are not equally spaced between the input voltages VB0 and VB1, and the interpolated voltages VD5, VD6, and VD7 also not equally spaced between the input voltages VB1 and VB0. As a result, the resultant ADC so designed will malfunction because of missing code.

One of the important features in the present invention is to alter the values of the resistors in the interpolation resistor ladder to overcome or avoid all collective parasitic and/or the loading effects so that the interpolated outputs are precisely and equally spaced between a predefined input range.

To facilitate the description of the present invention, it is assumed that a voltage drop on the interpolation resistors RI0, RI1, RI2, and RI3 are defined to be VRI0, VRI1, VRI2, and VRI3. Due to the parasitic effects and loadings, the voltages VRI0, VRI1, VRI2, and VRI3 are no longer evenly spaced. According to one embodiment, when it is detected that a voltage drop VRI2 on one of the interpolation resistor RI2 is large than the others, then the resistance of the resistor RI2 needs to be reduced so that to the voltage dropping on RI2 becomes smaller. Similar procedures may be applied to the rest of the interpolation resistors of the resistor interpolation section 1 until the voltage drops on the interpolation resistors are all equal. Likewise, the similar adjustment procedures are applied to resistors in the resistor interpolation section 2.

Since the interpolation resistors have the structure of ring type, the adjustment of the resistor interpolation section 1 may affect the already equally spaced results from the resistor interpolation section 2; and the adjustment of the resistor interpolation section 2 may also affect the already equally spaced results obtained from the resistor interpolation section 1. In one embodiment, a fine tune of each of the resistor interpolation sections is necessary.

According to one embodiment, if all the interpolation resistor values are normalized to one, as a final result, the interpolation resistor ratio from the resistor interpolation section 1 are designed to be RI0: RI1: RI2: RI3=1.00: 1.00: 1.00: 1.00. After systematic adjustments of these resistors, the interpolation resistor ratio has been changed to RI0: RI1: RI2: RI3=0.99: 1.00: 1.01: 1.00. And the interpolation resistor ratio of the interpolation section 2 designed by RI4: RI5: RI6: RI7=1.00: 1.00: 1.00: 1.00 has been changed to 1.00: 1.00: 1.01: 0.99. It should be noted that the ratio among the interpolation resistors is fairly random, there is no fixed ratio or ratios that can be predetermined. In other words, the interpolation resistors must be respectively adjusted in view of the actual inherent parasitic, loading or other effects at a given high frequency together with input frequencies.

FIG. 9 is a table showing a tabulated design of resistor interpolation with an interpolation factor of sixteen according to one embodiment. All interpolation resistors have been normalized, where the interpolation resistor RI111 has been chosen to be normalized to one. It should be understood to those skilled in the art that such arrangement is only for illustration purpose, one may choose any interpolation resistor to be normalized to one. From the table, it can be appreciated that the interpolation resistors that are supposed to be identical have been changed. For example, the first four interpolation resistors RI111, RI112, RI113, RI114 in the resistor interpolation section 1 have been changed to 1.0000, 0.8011, 0.6183, 0.50000; and the first four interpolation resistors RI211, RI212, RI213, RI214 in the resistor interpolation section 2 have been changed to 0.9624, 0.7634, 0.6075, 0.4893. As a result, the uneven interpolating spacing caused by parasitic and loadings have been corrected without adding extra delay components to compensate the transmission delay experienced in the prior art designs.

According to one aspect of the present invention, the interpolation resistors in each resistor interpolation section are individually adjusted to achieve a high level of output signal quality, evenly spaced interpolated voltages in the presence of such deterioration effects like output loading and interactions functionally coupled to each resistor interpolation sections.

As described above, by systematically adjusting the interpolation resistor ratio of the interpolation resistor in each of the resistor interpolation sections, one can achieve highly equally spaced interpolated signals without adding extra components. This is especially important for applications with high conversion rate for high-speed fold-and-interpolation analog-to-digital converters.

The current invention has been described using two resistor interpolation sections with an interpolation factor of four. However, those skilled in the art can appreciate that the embodiment can be easily adapted and extended to suit additional applications without departing from the spirit and scope of this invention. For example, the present invention may be applied to a resistor interpolation circuit with two resistor interpolation sections with a resistor interpolation factor of eight. Thus, a high resolution FIADC can be achieved. Likewise, an application of similar procedures to a resistor interpolation circuit having four resistor interpolation sections with resistor interpolation factor of sixteen, a higher resolution FIADC can be designed.

Figure 10:
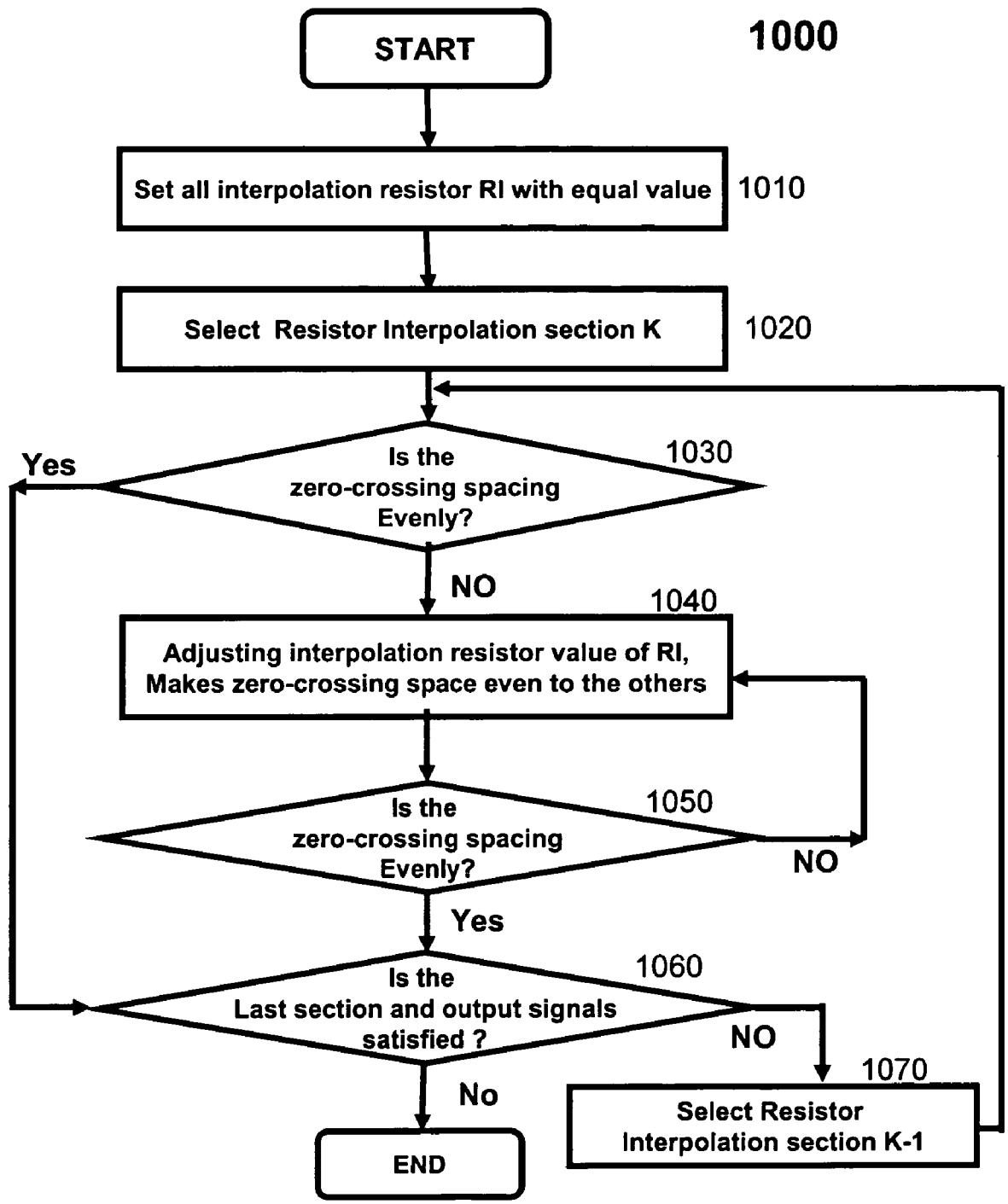
FIG. 10 shows a designing flowchart or process of systematically adjusting resistors in a resistor interpolation circuit.

Referring now to FIG. 10 shows a designing flowchart or process 1000 of systematically adjusting resistors in a resistor interpolation circuit. The process 1000 may be used in the circuit 700. At 1010, by theory design, all interpolating resistors values are set to be identical (e.g., 1 KΩ). At 1020, resister interpolations sections are determined. As described above, these sections are concatenated through the inputs signals. At 1030, given the design parameters, all output signals including the interpolated signals in one section are examined to determine if they are evenly spaced across the input range. If these signals are evenly spaced, the process 1000 goes from 1030 to 1060 where it determines whether the section is the last one. If not, the process 1000 goes to a next section and continues with the examination of the output signals at 1030.

At 1030, if all output signals including the interpolated signals in one section are examined to determine that they are not evenly spaced across the input range, at 1040, the originally determined equally valued resisters are respectively adjusted with reference to the output signals. In the end, all output signals including the interpolated signals in this section are evenly spaced across the input range at 1050. As a result, the originally determined equally valued resisters are no longer identical. Essentially, their originally unity ratios are changed so as to minimize the input and output parasitic effects as well as the output loading.

The present invention has been described in sufficient detail with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the forgoing description of embodiments.

We claim:

1. A method for designing an interpolation circuit, the method comprising:
   determining an initial value for all resisters in the interpolation circuit;

examining whether outputs from the interpolation circuit are evenly spaced across a predefined range of input signals;

when the outputs are not evenly spaced across a predefined range of input signals, adjusting each of the resistors in reference to the outputs so that the outputs are evenly spaced across a predefined range of input signals.

2. The method for designing an interpolation circuit as recited in claim 1, wherein a ratio among the resistors with the initial value is unity, a ratio among the resistors after being adjusted is no longer unity.

3. The method for designing an interpolation circuit as recited in claim 1, wherein the interpolation circuit includes at least two sections, each of the sections receives at least two complementary inputs and includes some of the resistors used to interpolate a number of interpolated outputs from the two complementary inputs.

4. The method for designing an interpolation circuit as recited in claim 3, wherein two adjacent sections share at least one complementary input.

5. The method for designing an interpolation circuit as recited in claim 4, wherein each of two sections produces outputs via an array of comparators, the outputs include a first output directly from one of the two complementary inputs, a second output directly from another one of the two complementary inputs, and the interpolated outputs.

6. The method for designing an interpolation circuit as recited in claim 3, wherein the two sections are formed in such a way that the two sections are concatenated through the inputs.

7. The method for designing an interpolation circuit as recited in claim 3, wherein, if the interpolation circuit is structured for producing N outputs, there are at least 2N such resistors, each section including N such resistors.

8. An interpolation circuit, the interpolation circuit comprising:

resistors divided into two groups, the resistors in each of the groups connected in series, the two groups respectively receiving two complementary inputs from which interpolated outputs are generated, wherein the resistors originally designed to be identical are adjusted to be non-identical to each other so that the outputs are evenly spaced across a predefined range of the input signals.

9. The interpolation circuit as recited in claim 8, wherein each of the resistors is adjusted in reference to the outputs so that the outputs are evenly spaced across a predefined range of input signals.

10. The interpolation circuit as recited in claim 9, wherein a ratio among the resistors originally designed is unity, a ratio among the resistors after being adjusted is no longer unity.

11. The interpolation circuit as recited in claim 8, wherein the interpolation circuit includes at least two sections, each of the sections receives at least two complementary inputs and includes some of the resistors used to interpolate a number of interpolated outputs from the two complementary inputs.

12. The interpolation circuit as recited in claim 11, wherein two adjacent sections share at least one of the complementary inputs.

13. The interpolation circuit as recited in claim 11, wherein each of two sections produces outputs via an array of comparators, the outputs include a first output directly from one of the two complementary inputs, a second output directly from another one of the two complementary inputs, and the interpolated outputs.

14. The interpolation circuit as recited in claim 13, wherein the two sections are formed in such a way that the two sections are concatenated through the inputs.

15. The interpolation circuit as recited in claim 8, wherein, if the interpolation circuit is structured for producing N outputs, there are at least 2N such resistors, each section including N such resistors.

16. The interpolation circuit as recited in claim 8, wherein the interpolation circuit is part of a high-speed analog-to-digital converter.

17. The interpolation circuit as recited in claim 16, wherein the analog-to-digital converter is structured based on folding and interpolation techniques.

* * * * *